United States Patent
Shao et al.

(10) Patent No.: US 11,175,430 B1
(45) Date of Patent: Nov. 16, 2021

(54) PROCESSING NUCLEAR MAGNETIC RESONANCE SIGNALS IN A DOWNHOLE ENVIRONMENT

(71) Applicant: Halliburton Energy Services, Inc., Houston, TX (US)

(72) Inventors: Wei Shao, Conroe, TX (US); Songhua Chen, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 16/878,261

(22) Filed: May 19, 2020

(51) Int. Cl.
   *G01V 3/32* (2006.01)
   *G01R 33/38* (2006.01)
   *G01R 33/54* (2006.01)
   *G01R 33/44* (2006.01)
   *G01R 33/56* (2006.01)

(52) U.S. Cl.
   CPC ........... *G01V 3/32* (2013.01); *G01R 33/3808* (2013.01); *G01R 33/445* (2013.01); *G01R 33/543* (2013.01); *G01R 33/5608* (2013.01)

(58) Field of Classification Search
   USPC ........................................................ 324/303
   See application file for complete search history.

(56) References Cited

U.S. PATENT DOCUMENTS

| | | | |
|---|---|---|---|
| 7,043,370 B2 | 5/2006 | Yu et al. | |
| 7,565,833 B2 | 7/2009 | Gillen et al. | |
| 8,022,698 B2 | 9/2011 | Rottengatter et al. | |
| 8,305,243 B2 | 11/2012 | Yu et al. | |
| 2003/0214286 A1 | 11/2003 | Heidler | |
| 2005/0140368 A1* | 6/2005 | Freedman | G01F 1/716 324/303 |
| 2006/0186882 A1 | 8/2006 | Walsh | |
| 2008/0036457 A1 | 2/2008 | Thern et al. | |
| 2013/0214779 A1 | 8/2013 | Tietjen et al. | |

(Continued)

FOREIGN PATENT DOCUMENTS

| | | |
|---|---|---|
| EP | 1852718 A2 | 11/2007 |
| WO | 2013-151985 | 10/2013 |

OTHER PUBLICATIONS

Alvarado et al., "Nuclear Magnetic Resonance Logging While Drilling", Oilfield Review 2003 (see p. 40, and 42).

(Continued)

*Primary Examiner* — Rodney E Fuller
(74) *Attorney, Agent, or Firm* — Benjamin Ford; C. Tumey Law Group PLLC

(57) ABSTRACT

Systems and methods of the present disclosure relate to processing nuclear magnetic resonance (NMR) data. An NMR downhole tool may include a housing, magnets disposed within the housing, an antenna extending along a circumference of the housing, and an information handling system configured to receive NMR signals via the antenna, wherein the NMR signals are based on an operating frequency, a static magnetic field $B_0$, and a radio frequency (RF) field $B_1$, which are defined by the antenna and the magnets. The information handling system may be further configured to project the NMR signals to a forward modeling space, and transmit vectors resulting from projecting the NMR signals to the forward modeling space.

20 Claims, 6 Drawing Sheets

(56) References Cited

U.S. PATENT DOCUMENTS

| | | | |
|---|---|---|---|
| 2013/0268201 A1* | 10/2013 | Gzara | G01V 9/00 702/8 |
| 2014/0167759 A1 | 6/2014 | Pines et al. | |
| 2017/0176627 A1 | 6/2017 | Venkataramanan et al. | |

OTHER PUBLICATIONS

International Search Report and Written Opinion for Application No. PCT/US2020/034785, dated Feb. 2, 2021.

\* cited by examiner

PROCESSING NUCLEAR MAGNETIC RESONANCE SIGNALS IN A DOWNHOLE ENVIRONMENT

BACKGROUND

During hydrocarbon exploration and production, nuclear magnetic resonance (NMR) may be utilized to acquire data from a downhole environment. NMR logging measures an induced magnet moment of hydrogen nuclei (protons) contained within fluid-filled pore space of porous media such as reservoir rocks. Unlike conventional logging measurements (e.g., acoustic, density, neutron, and resistivity), which are dependent on mineralogy and respond to a rock matrix and fluid properties, NMR-logging measurements respond to a presence of hydrogen in pore fluids, such as water and hydrocarbons, for example. NMR effectively responds to a volume, a composition, a viscosity, and a distribution of the pore fluids. NMR logs provide information about the quantities of fluids present, the properties of these fluids, and sizes of the pores containing these fluids. From this information, it is possible to determine a porosity and permeability of a reservoir rock, a rock composition, type and quantity of hydrocarbons, and hydrocarbon producibility, for example.

BRIEF DESCRIPTION OF THE DRAWINGS

These drawings illustrate certain aspects of some examples of the present disclosure and should not be used to limit or define the disclosure.

DETAILED DESCRIPTION

The present disclosure generally relates to techniques for NMR data processing. Rather than compressing NMR signals in a downhole environment and transmitting them to the surface for processing, techniques disclosed herein may transmit projections of the NMR signals to an NMR forward modeling space. Resulting approximations or values from the forward modeling space may then be transmitted to the surface for processing in real time, thereby allowing operators to make timely decisions during drilling, for example. Specifically, vectors resulting from the projections may be transmitted to the surface for processing, in some examples. Zero errors or a minimal amount of errors are introduced from the processing and/or transmitting techniques disclosed herein.

Figure 1:
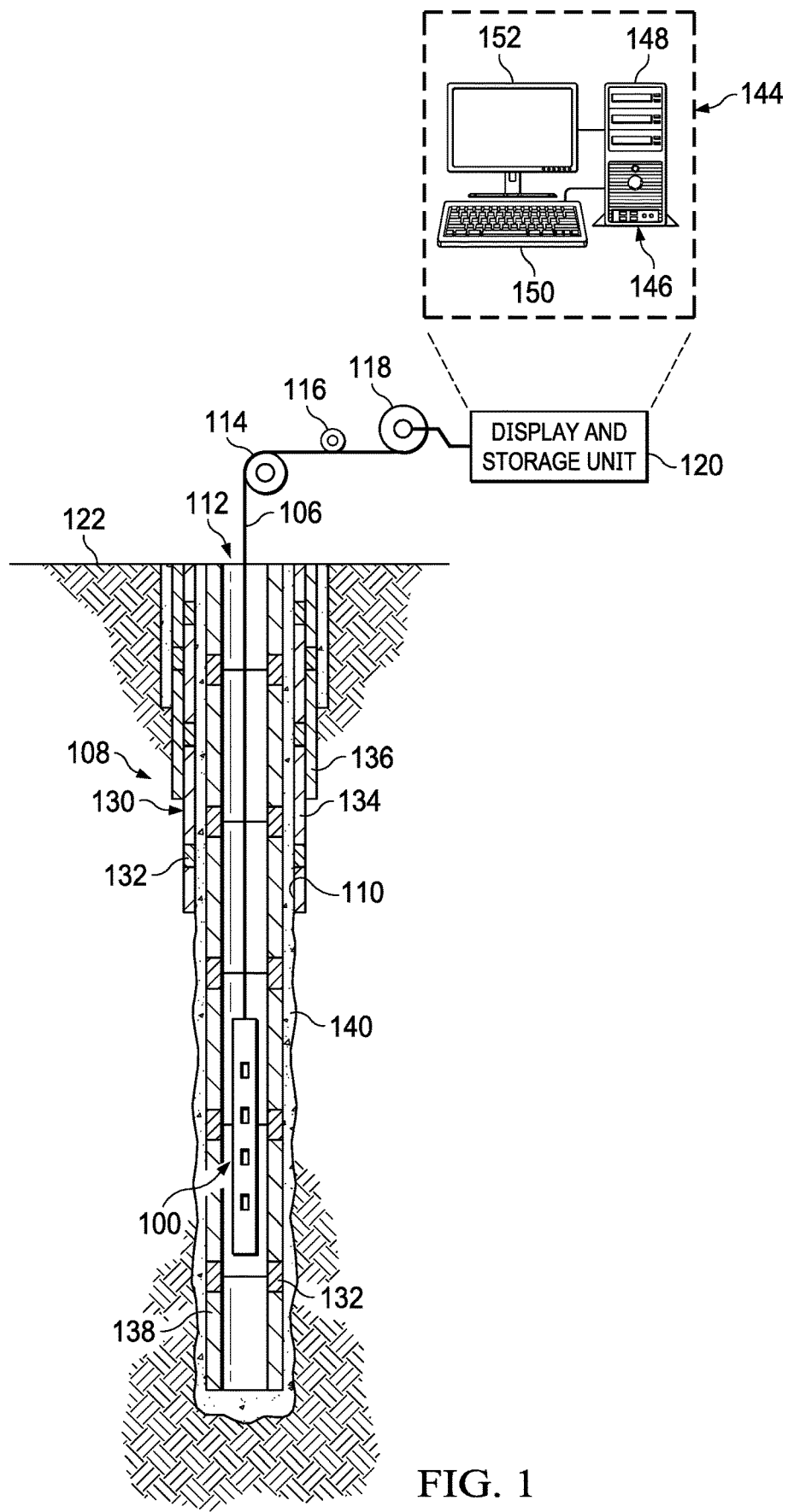
FIG. 1 illustrates an NMR tool in a wireline configuration, in accordance with examples of the present disclosure.

FIG. 1 illustrates an operating environment for an NMR tool 100, in accordance with examples of the present disclosure. It should be noted that while FIG. 1 generally depicts a land-based operation, those skilled in the art may recognize that the principles described herein are equally applicable to subsea operations that employ floating or sea-based platforms and rigs, without departing from the scope of the disclosure.

As illustrated, the NMR tool 100 may be operatively coupled to a conveyance 106 (e.g., wireline, slickline, coiled tubing, pipe, downhole tractor, and/or the like) which may provide mechanical suspension, as well as electrical connectivity, for the NMR tool 100. It should be understood that the configuration of NMR tool 100 shown on FIG. 1 is merely illustrative and other configurations of the NMR tool 100 may be used with the present techniques.

A conveyance 106 and the NMR tool 100 may extend within a casing string 108 to a desired depth within the wellbore 110. The conveyance 106, which may include one or more electrical conductors, may exit a wellhead 112, may pass around a pulley 114, may engage an odometer 116, and may be reeled onto a winch 118, which may be employed to raise and lower the NMR tool 100 in the wellbore 110. Signals recorded by the NMR tool 100 may be stored on memory and then processed by a display and storage unit 120 after recovery of the NMR tool 100 from the wellbore 110. Alternatively, signals recorded by the NMR tool 100 may be transmitted to the display and storage unit 120 by way of the conveyance 106. The display and storage unit 120 may process the signals, and the information contained therein may be displayed for an operator to observe and store for future processing and reference. Alternatively, the signals may be processed downhole prior to receipt by display and storage unit 120 or both downhole and at a surface 122, for example. The display and storage unit 120 may also contain an apparatus for supplying control signals and power to the NMR tool 100. The casing string 108 may extend from the wellhead 112 at or above ground level to a selected depth within the wellbore 110. The casing string 108 may comprise a plurality of joints 130 or segments of the casing string 108, each joint 130 being connected to the adjacent segments by a collar 132. There may be any number of layers in the casing string 108. For example, the layers may include a first casing 134 and a second casing 136.

FIG. 1 also illustrates a pipe string 138, which may be positioned inside of casing string 108 extending part of the distance down wellbore 110. Pipe string 138 may be production tubing, tubing string, casing string, or other pipe disposed within casing string 108. Pipe string 138 may comprise concentric pipes. It should be noted that concentric pipes may be connected by collars 132. The NMR tool 100 may be dimensioned so that it may be lowered into the wellbore 110 through the pipe string 138, thus avoiding the difficulty and expense associated with pulling pipe string 138 out of wellbore 110. In examples, cement 140 may be disposed on the outside of pipe string 138. Cement 140 may further be disposed between pipe string 138 and casing string 108. It should be noted that cement 140 may be disposed between any number of casings, for example between the first casing 134 and the second casing 136.

In logging systems utilizing the NMR tool 100, a digital telemetry system may be employed, wherein an electrical circuit may be used to both supply power to the NMR tool 100 and to transfer data between the display and storage unit 120 and the NMR tool 100. A DC voltage may be provided to the NMR tool 100 by a power supply located above ground level, and data may be coupled to the DC power conductor by a baseband current pulse system. Alternatively, the NMR tool 100 may be powered by batteries located within the downhole tool assembly, and/or the data provided by the NMR tool 100 may be stored within the downhole tool assembly, rather than transmitted to the surface during logging.

In certain examples, operation and function of the NMR tool 100 may be controlled at the surface 122 by a computer or an information handling system 144. As illustrated, the information handling system 144 may be a component of the display and storage unit 120. The information handling system 144 may include any instrumentality or aggregate of instrumentalities operable to compute, estimate, classify, process, transmit, receive, retrieve, originate, switch, store, display, manifest, detect, record, reproduce, handle, or utilize any form of information, intelligence, or data for business, scientific, control, or other purposes. For example, the information handling system 144 may be a personal computer, a network storage device, or any other suitable device and may vary in size, shape, performance, functionality, and price. The information handling system 144 may include a processing unit 146 (e.g., microprocessor, central processing unit, etc.) that may process EM log data by executing software or instructions obtained from a local non-transitory computer readable media 148 (e.g., optical disks, magnetic disks). The non-transitory computer readable media 148 may store software or instructions of the methods described herein. Non-transitory computer readable media 148 may include any instrumentality or aggregation of instrumentalities that may retain data and/or instructions for a period of time. The non-transitory computer readable media 148 may include, for example, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing. At the surface 122, the information handling system 144 may also include input device(s) 150 (e.g., keyboard, mouse, touchpad, etc.) and output device(s) 152 (e.g., monitor, printer, etc.). The input device(s) 150 and output device(s) 152 provide a user interface that enables an operator to interact with the NMR tool 100 and/or software executed by processing unit 146. For example, the information handling system 144 may enable an operator to select analysis options, view collected log data, view analysis results, and/or perform other tasks. In examples, the NMR tool 100 and the information handling system 144 may be utilized to measure properties (e.g., NMR properties) in a downhole environment.

Figure 2:
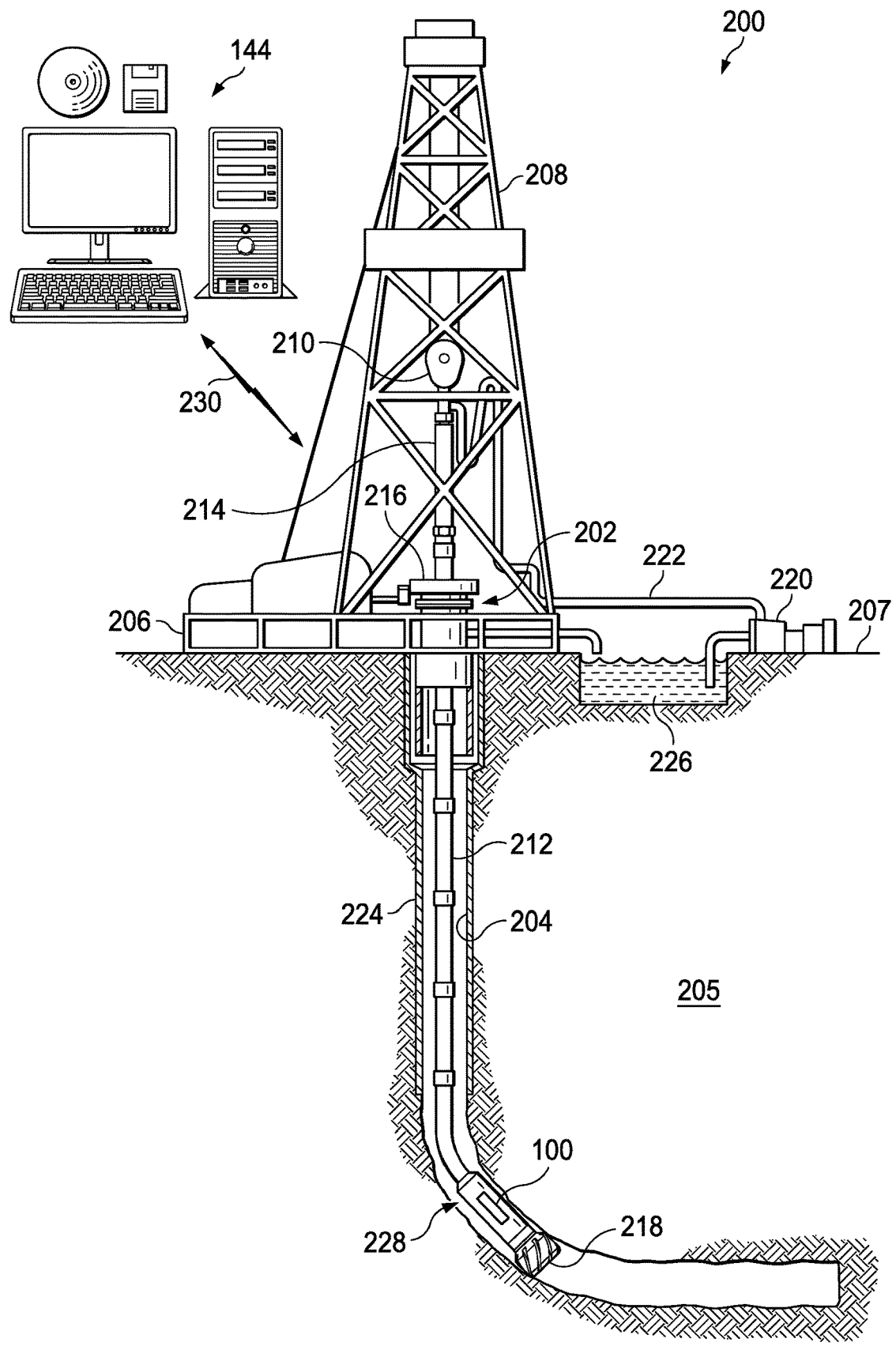
FIG. 2 illustrates an NMR tool in a drilling configuration, in accordance with examples of the present disclosure.

FIG. 2 illustrates an example of the NMR tool 100 included in a drilling system 200, in accordance with examples of the present disclosure. It should be noted that while FIG. 2 generally depicts a land-based operation, those skilled in the art may recognize that the principles described herein are equally applicable to subsea operations that employ floating or sea-based platforms and rigs, without departing from the scope of the disclosure.

As illustrated, a borehole 204 may extend from a wellhead 202 into a subterranean formation 205 from a surface 207. The borehole 204 may include horizontal, vertical, slanted, curved, and other types of borehole geometries and orientations. A drilling platform 206 may support a derrick 208 having a traveling block 210 for raising and lowering a drill string 212. The drill string 212 may include, but is not limited to, drill pipe and coiled tubing, as generally known to those skilled in the art. A top drive or kelly 214 may support the drill string 212 as it may be lowered through a rotary table 216.

A drill bit 218 may be attached to the distal end of drill string 212 and may be driven either by a downhole motor and/or via rotation of drill string 212 from the surface 207. Without limitation, the drill bit 218 may include roller cone bits, PDC bits, natural diamond bits, any hole openers, reamers, coring bits, and the like. As the drill bit 218 rotates, it may create and extend borehole 204 that penetrates the subterranean formation 205. A pump 220 may circulate drilling fluid through a feed pipe 222 to the kelly 214, downhole through the interior of the drill string 212, through orifices in the drill bit 218, back to the surface 207 via an annulus 224 surrounding the drill string 212, and into a retention pit 226.

The drill string 212 may begin at wellhead 202 and may traverse borehole 204. The drill bit 218 may be attached to a distal end of the drill string 212 and may be driven, for example, either by a downhole motor and/or via rotation of the drill string 212 from the surface 207. The drill bit 218 may be a part of a bottom hole assembly 228 at a distal end of the drill string 212. The bottom hole assembly 228 may include the NMR tool 100 via threaded connections, for example. As will be appreciated by those of ordinary skill in the art, bottom hole assembly 228 may be a measurement-while drilling (MWD) or logging-while-drilling (LWD) system.

Without limitation, the NMR tool 100 may be connected to and/or controlled by the information handling system 144. Processing of information recorded may occur downhole and/or at the surface 207. Data being processed downhole may be transmitted to the surface 207 to be recorded, observed, and/or further analyzed. Additionally, the data may be stored in memory of the NMR tool 100 while the NMR tool 100 is disposed downhole.

In some examples, wireless communication may be used to transmit information back and forth between the information handling system 144 and the NMR tool 100. The information handling system 144 may transmit information to the NMR tool 100 and may receive, as well as process information recorded by the NMR tool 100. In examples, while not illustrated, the bottom hole assembly 228 may include one or more additional components, such as an analog-to-digital converter, filter and amplifier, among others, that may be used to process the measurements of the NMR tool 100 before they may be transmitted to the surface 207. Alternatively, raw measurements may be transmitted to the surface 207 from the NMR tool 100.

Any suitable technique may be used for transmitting signals from the NMR tool 100 to the surface 207, including, but not limited to, wired pipe telemetry, mud-pulse telemetry, acoustic telemetry, and electromagnetic telemetry. While not illustrated, the bottom hole assembly 228 may include a telemetry subassembly that may transmit telemetry data to the surface 207. Without limitation, an electromagnetic source in the telemetry subassembly may be operable to generate pressure pulses in the drilling fluid that propagate along the fluid stream to the surface 207. At the surface 207, pressure transducers (not shown) may convert the pressure signal into electrical signals for a digitizer (not illustrated). The digitizer may supply a digital form of the telemetry signals to the information handling system 144 via a communication link 230, which may be a wired or wireless link. The telemetry data may be analyzed and processed by the information handling system 144.

Figure 3A:
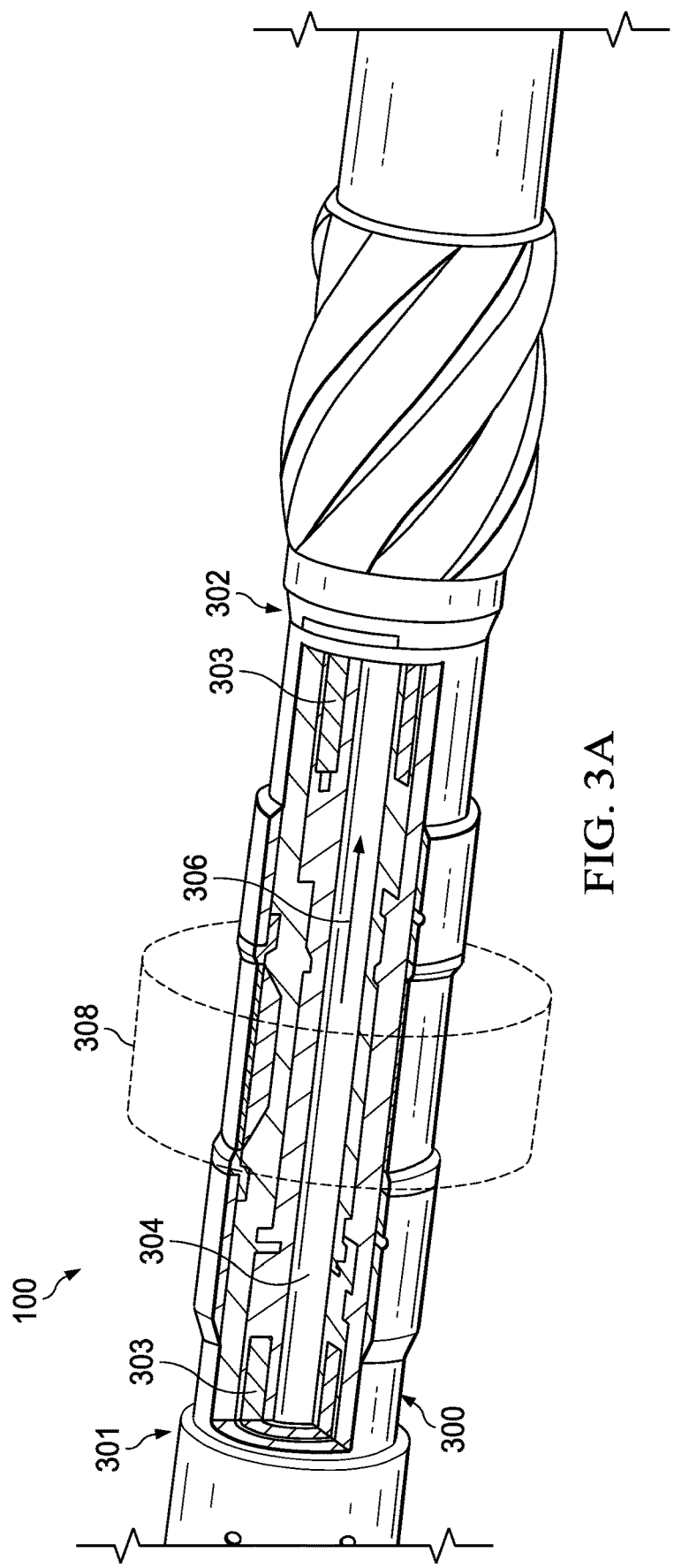
FIG. 3A illustrates a close-up cutaway perspective view of the NMR tool, in accordance with examples of the present disclosure.

FIG. 3A illustrates a cutaway close-up view of the NMR tool 100 in accordance with some examples of the present disclosure. The NMR tool 100 is a non-limiting example and other suitable NMR tools may be utilized, as should be understood by one having skill in the art, with the benefit of this disclosure. The NMR tool 100 may include a housing 300 that may be of a cylindrical or tubular shape that extends longitudinally from a first end 301 to a second end 302. In certain examples, the first end 301 and the second end 302 may be threaded for connection to a drill string for example. Magnets 303 may be disposed within the housing 300. The magnets 303 may be of a tubular shape and may include samarium-cobalt magnets, for example. In some examples, the magnets 303 may encompass a passage 304 that extends longitudinally through the housing 300. The passage 304 may receive a fluid 306 (e.g., a drilling fluid) flowing in a downhole direction, as illustrated. A magnetic field 308 is emitted from the magnets 303 and surrounds or encompasses the housing 304. The NMR tool 100 may receive the fluid 306 at a rate ranging from 200 gallons per minute to 1000 gallons per minute, in some examples.

Figure 3B:
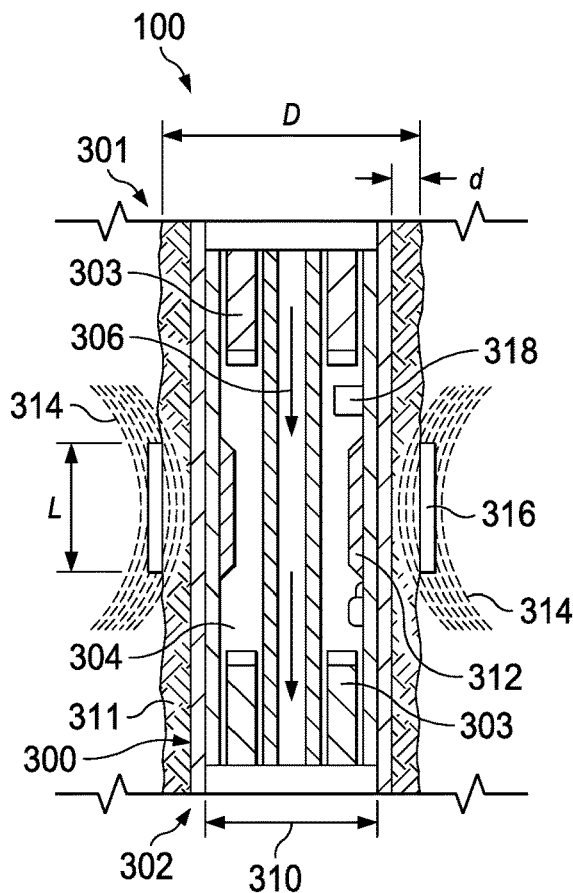
FIG. 3B illustrates an axial cross-sectional view of the NMR tool, in accordance with examples of the present disclosure.

FIG. 3B illustrates an axial cross-section of the NMR tool 100, in accordance with some examples of the present disclosure. The NMR tool 100 may be disposed in a wellbore 310. The passage 304 may extend through a center of the NMR tool 100 and may pass the fluid 306 from the first end 301 (e.g., an up-hole end) to the second end 302 (e.g., a downhole end). The NMR tool 100 may further include a coaxially coil or antenna 312 wound about the NMR tool 100 or wound around an inner (e.g., interior of the NMR tool 100) or outer circumference (e.g., exterior of the NMR tool 100) of the housing 300. A diameter of investigation, D, that extends into a subterranean formation 311, may range from 8 inches to 20 inches, for example.

A magnetic field gradient 314 decays away from the NMR tool 100, as illustrated. At a selected operating frequency, the antenna 312 transmits radio frequency ("RF") energy or field $B_1$ to the formation, the antenna and a static magnetic field Bo generated by the magnets 303 defines a sensitive volume, in the form of a resonant shell 316 that may encompass the NMR tool 100. The same antenna can also serve as the receiving antenna or a separate receiving antenna can be used to receive the nuclear magnetic resonance signal from the fluids in the sensitive volume. The resonant shell 316 may extend longitudinally and have a length, L, ranging from 2 inches (5 centimeters (cm)) to 12 inches (30 cm), for example. Alternatively, the resonant shell 316 may have a length that is less than 2 inches (5 cm) or greater than 12 inches (30 cm), in some examples. A depth, d, of investigation into the subterranean formation 311 may range from 2 inches (5 cm) to 12 inches (30 cm) in some examples. The resonant shell 316 may include a thickness ranging from 0.1 inches (10 millimeters (mm)) to 1 inch (25 mm), for example.

In certain examples, the resonant shell 316 is the only location in the subterranean formation 311 where measurements are taken with the NMR tool 100 (e.g., via the antenna 312). Measurements are not made between the NMR tool 100 and the resonant shell 316, and from the resonant shell 316 to further into the subterranean formation 311. In certain examples, the NMR tool 100 may include a downhole computer or downhole information handling system 318 for controlling and operating the NMR tool 100. The downhole information handling system 318 may be disposed within the housing 300 and may include components that may be similar to the information handling system 144 as previously described, such as, for example, a microprocessor, a memory, or other suitable circuitry, for estimating, receiving, storing, and/or processing signals or data in a downhole environment.

Table 1 shows an NMR logging while drilling (LWD) activation sequences in $T_1$ mode. This activation sequences acquire 170 data points in one cycle.

TABLE 1

| NMR LWD Activation Sequences in $T_1$ Mode. | | | | |
|---|---|---|---|---|
| Echo Train Identification Number | Wait Time (TW) (milliseconds) | Echo Time (TE) (milliseconds) | Number of Echoes (NE) | Repeats |
| 1 | 12000 | 0.5 | 40 | 1 |
| 2 | 1000 | 0.5 | 40 | 1 |
| 3 | 300 | 0.5 | 20 | 1 |
| 4 | 100 | 0.5 | 20 | 1 |
| 5 | 30 | 0.5 | 20 | 1 |
| 6 | 10 | 0.5 | 20 | 1 |
| 7 | 3 | 0.5 | 5 | 4 |
| 8 | 1 | 0.5 | 5 | 4 |

Table 2 is an example of NMR LWD activation sequences in $T_2$ mode, which acquire 2020 data points in one cycle.

TABLE 2

| NMR LWD Activation Sequences in $T_2$ Mode. | | | | |
|---|---|---|---|---|
| Echo Train Identification Number | Wait Time (TW) (milliseconds) | Echo Time (TE) (milliseconds) | Number of Echoes (NE) | Repeats |
| 1 | 12000 | 0.5 | 2000 | 1 |
| 2 | 30 | 0.5 | 20 | 32 |

An example of implanting both $T_1$ and $T_2$ data acquisition is to modify the $T_1$ activation described in Table 1 by increase the number of echoes to 1000 for the echo train ID #1. Since LWD may have a limited telemetry bandwidth, it may not be possible to transmit acquired NMR signals to the surface for processing in real time.

A first option may be to process NMR signals downhole in real time. However, due to a limitation of the computational power and the size of memory downhole, NMR signal processing downhole, may be constrained by several factors. For example, a number of bins for NMR inversion may be limited, such as 12 bins downhole and 30 or 54 bins at the surface. In some examples, only a subset of acquired NMR signals is used for the inversion. Hence, NMR signal processing downhole may have low spectral resolution for NMR distribution and inaccurate reservoir parameter estimation.

A second option may be to compress the NMR signals downhole and transmit the compressed data to the surface. The compressed data may then be reconstructed into reconstructed NMR signals at the surface for processing. A drawback about compression methods may be that some information about NMR signals may not be recoverable. For example, the reconstructed NMR signals may not possess the multi exponential decay characteristic of the original NMR signals.

The present disclosure describes techniques for transmitting NMR data from a downhole environment to the surface for NMR data processing in real time. Instead of compressing the NMR signal b directly in the downhole environment, the NMR signal b may be projected to an NMR forward modeling space A defined by Equation 1. Vectors resulting from the projection may then be transmitted to the surface (e.g., the surface 122 shown on FIG. 1) for processing. Systems and methods of the present disclosure may involve solving the following constrained linear system:

$$Ax=b, x \geq 0 \quad (1)$$

where A is a matrix of size M×N, and b is an NMR response vector of size M×a total number of echoes. N is a number of unknowns or a number of bins.

The NMR inversion process described by the Equation 1 is an ill-conditioned linear system. An approach to solving the ill-conditioned linear system may be to utilize Tikhonov regularization method for least square minimization problem. The least square solution with Tikhonov regularization method to the linear system of the Equation 1 is:

$$X_{ls}=(A'A+\alpha L'L)^{-1}A'b, x_{ls} \geq 0 \quad (2)$$

where L is the regularization matrix of size N×N, and a is the regularization parameter.

$x_{ls}$ is a product of the matrix $(A'A+\alpha L'L)^{-1}$ and the vector A'b. The matrix $(A'A+\alpha L'L)^{-1}$ only depends on NMR activation sequence parameters and inversion parameters. The NMR signal b only appears in the vector A'b. Therefore, the Equation 1 may be solved in real time on the surface if the vector A'b is available on the surface. In other words, only the vector A'b may need to be transmitted to the surface instead of the NMR signal b.

The size of the vector A'b is N, where N is the number of unknowns, while the size of b is M, where M is the total number of NMR signals. In certain examples, M>>N for NMR data acquisition and processing. For example, M is 170 for the NMR activation sequence described in Table 1. A number for N is 12, 30, or 54. Due to the limitation of memory size and computation power downhole, NMR real time data processing in a downhole environment uses the least number for N (such as 12) as possible without substantially compromising spectra resolution for NMR distribution. For NMR data processing on the surface, 30 or 54 unknowns may be used for NMR inversion. In certain examples, the vector A'b is transmitted directly to surface, if N is a small number, and applied to Equation 2 to obtain NMR distributions.

For larger N, such as 30 or 54, the size of the vector A'b may be too large to be transmitted to the surface via LWD bandwidth. In certain examples, systems and methods of the present disclosure may reduce a row vector space of A' with an orthogonal-triangular decomposition method (QR), and project the NMR signal b into a reduced row vector space of A'.

Assuming an orthogonal-triangle decomposition of A' is in the following form:

$$A'=QR \quad (3)$$

where Q is a unitary matrix, R is an upper triangular matrix. Then, the Equation 2 may be rewritten as the following:

$$x_{ls} = (A'A + \alpha L'L)^{-1} QRb = ((A'A + \alpha L'L)^{-1} Q) \begin{pmatrix} \langle r_1, b \rangle \\ \vdots \\ \langle r_k, b \rangle \\ \vdots \\ \langle r_N, b \rangle \end{pmatrix} \quad (4)$$

where $r_k$ is the $k^{th}$ row vector of the matrix R, k=1, ..., N, and $\langle r_k, b \rangle$ is the vector dot product of $r_k$ with NMR signal b. One unique property of the row vectors $\{r_k, k=1, \ldots, N\}$ of the matrix R is that the $L_1$ norms of $r_k$ decay to 0 rapidly. The $L_1$ norm of $r_k$ is defined as $$\|r_k\|_1 = \sum_{l=1}^{M} |r_{k,l}|,$$

where $r_{k,l}$ is the $l^{th}$ element of the vector $r_k$.

$x_{ls}$ in Equation 4 can be approximated with the following:

$$x_{ls} \approx ((A'A + \alpha L'L)^{-1} Q) \begin{pmatrix} \langle r_1, b \rangle \\ \vdots \\ \langle r_K, b \rangle \\ 0 \\ \vdots \\ 0 \end{pmatrix} \quad (5)$$

The K is the index such that $$\sum_{k=K+1}^{N} \|r_k\|_1 < 10^{-4}. \text{ For } N = 54, K$$

is 20; while for N=30, K is 19.

The approximation error of using $$\begin{pmatrix} \langle r_1, b \rangle \\ \vdots \\ \langle r_K, b \rangle \\ 0 \\ \vdots \\ 0 \end{pmatrix}$$

for $$\begin{pmatrix} \langle r_1, b \rangle \\ \vdots \\ \langle r_k, b \rangle \\ \vdots \\ \langle r_N, b \rangle \end{pmatrix}$$

is bounded by:

$$\max(b) \sum_{k=K+1}^{N} \|r_k\|_1 < 10^{-4} \max(b) \quad (6)$$

In certain examples, a reservoir porosity may be less than 40 porosity units, thus the max(b) may also be less than 40 porosity units. Therefore, an error due to the approximation is minimal and should not affect accuracy of NMR data processing.

In some examples, systems and methods of the present disclosure may transmit a subset of vector dot products {

$\langle r_k, b \rangle$, k=1, ..., N) to surface for NMR data processing. For the activation sequences with 170 echoes in Table 1, only 20 data points may need to be transmitted to the surface for NMR inversion with 54 number of unknowns. A sum of squared errors may be used to quality control NMR data processing. The sum of squared errors may be defined as:

$$SSE = \sum_{i=1}^{M} ((Ax_{ls})_i - b_i)^2 \quad (7)$$

where $b_i$ is the $i^{th}$ echo of NMR signal b, $(Ax_{ls})_i$ is the $i^{th}$ component of the forward modeled vector $Ax_{ls}$.

The NMR signal b is not transmitted to surface, and it is not available for computing SSE. However, the Eq. (7) can be reformulated as the following:

$$SSE = x_{ls}'A'Ax_{ls} - 2\langle x_{ls}, A'b \rangle + \langle b,b \rangle \quad (8)$$

Two terms of Equation 8 need an NMR signal b to be computed: $\langle x_{ls}, A'b \rangle$ and $\langle b,b \rangle$. $\langle b,b \rangle$ may be a single floating data point, and it can be computed in the downhole environment and transmitted to the surface. If the vector A'b is transmitted to the surface, $\langle x_{ls}, A'b \rangle$ can be computed on the surface.

If a subset of $\{\langle r_k, b \rangle, k=1, \ldots, N\}$ is transmitted to surface, then $\langle x_{ls}, A'b \rangle$ can be estimated as the following:

$$\langle x_{ls}, A'b \rangle = \quad (9)$$

$$\langle x_{ls}, QRb \rangle = \langle Q'x_{ls}, Rb \rangle = \left\langle Q'x_{ls}, \begin{pmatrix} \langle r_1, b \rangle \\ \vdots \\ \langle r_k, b \rangle \\ \vdots \\ \langle r_N, b \rangle \end{pmatrix} \right\rangle \approx \left\langle Q'x_{ls}, \begin{pmatrix} \langle r_1, b \rangle \\ \vdots \\ \langle r_K, b \rangle \\ 0 \\ \vdots \\ 0 \end{pmatrix} \right\rangle$$

where k is the number of $\langle r_k, b \rangle$ to be transmitted to the surface. The error due to the estimation error is very small, and is bounded by:

$$\max(x_{ls}) \sum_{k=K+1}^{N} \|r_k\|_1 < 10^{-4} \max(x_{ls}) \quad (10)$$

In some examples, systems and methods of the present disclosure may transmit the dot product $\langle b,b \rangle$ for NMR data processing quality control. It should be noted that the methods described in this disclosure for transmitting NMR signals also work for wireline NMR logging, and any measurements whose solutions can be expressed in the forms resembling Equation 2. Systems and methods of the present disclosure may also be extendable to data acquired via a $T_1$-$T_2$ data acquisition scheme.

Figure 4:
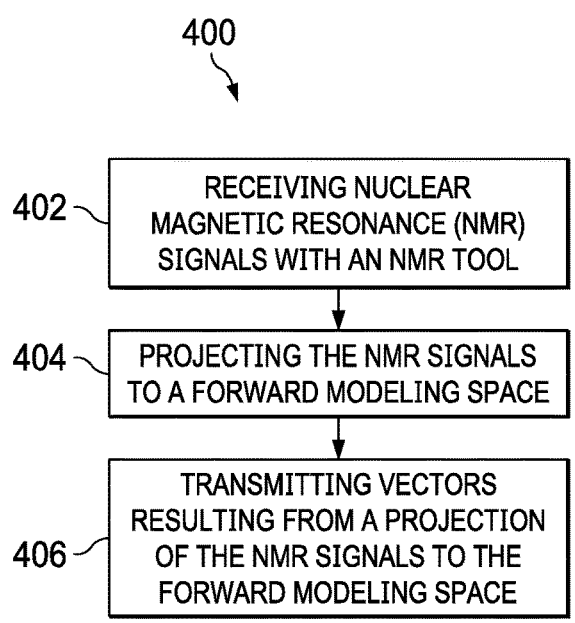
FIG. 4 illustrates a flow chart depicting an operative sequence of the NMR tool, in accordance with examples of the present disclosure.

FIG. 4 illustrates a sequence 400 for processing NMR signals with the NMR tool 100, in accordance with examples of the present disclosure. At step 402, the NMR tool 100 (e.g., shown on FIGS. 3A and 3B) may receive NMR signals from a downhole environment. At step 404, the NMR tool 100 may project the NMR signals to a forward modeling space via Equations 1-10, for example. At step 406, the NMR tool 100 may transmit vectors resulting from the projections of the NMR signals(s) to the forward modeling space, to the surface 207 for processing (e.g., as shown on FIG. 2).

Figure 5:
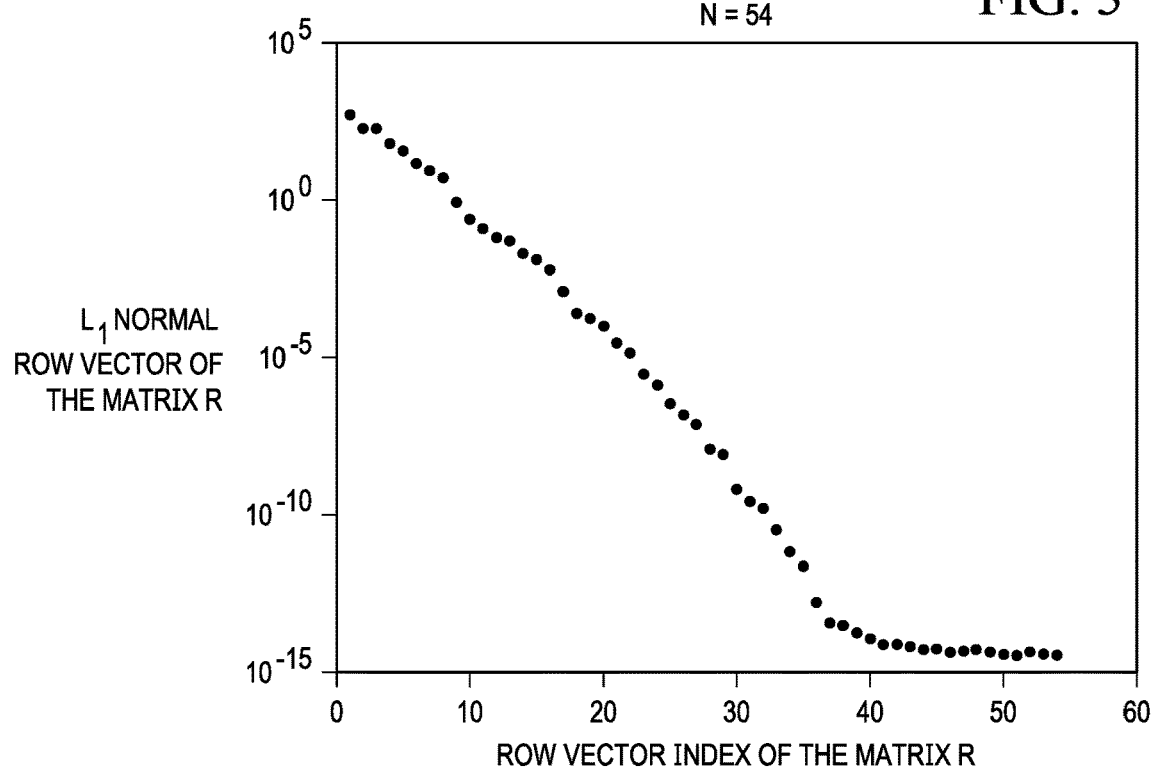
FIGS. 5 and 6 illustrate graphs depicting decay rates of components of a matrix for an NMR tool activation sequence, in accordance with examples of the present disclosure.
Figure 6:
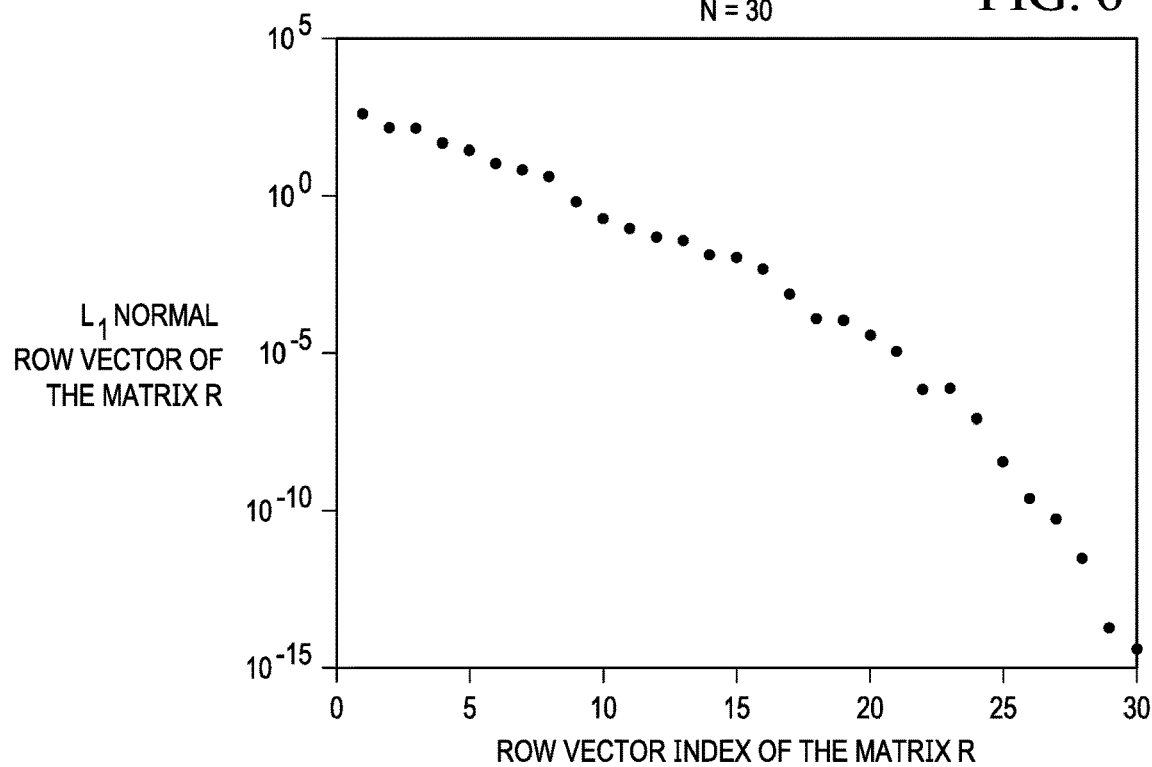

FIG. 5 and FIG. 6 show decay rates of the $L_1$ norms of $r_k$ for the activation sequences in Table 1 of the $T_1$ mode, in accordance with examples of the present disclosure. As shown on FIG. 1, for N=54, the $L_1$ norms of row vectors after $20^{th}$ are less than $10^{-4}$, and $$\sum_{k=21}^{54} \|r_k\|_1 < 10^{-4}.$$

As shown on FIG. 2, for N=30, the $L_1$ norms of row vectors after $19^{th}$ are less than $10^{-4}$, and $$\sum_{k=20}^{30} \|r_k\|_1 < 10^{-4}.$$

Figure 7:
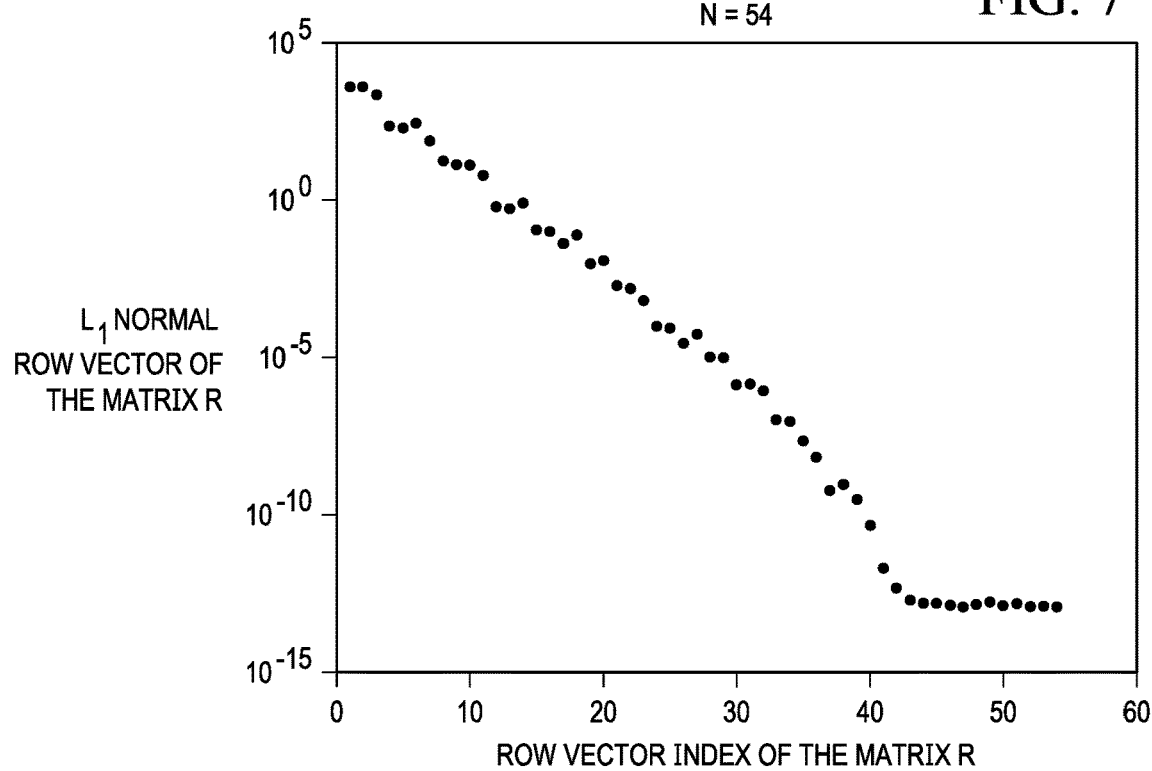
FIGS. 7 and 8 illustrate graphs depicting decay rates of components of a matrix for another NMR tool activation sequence, in accordance with examples of the present disclosure.
Figure 8:
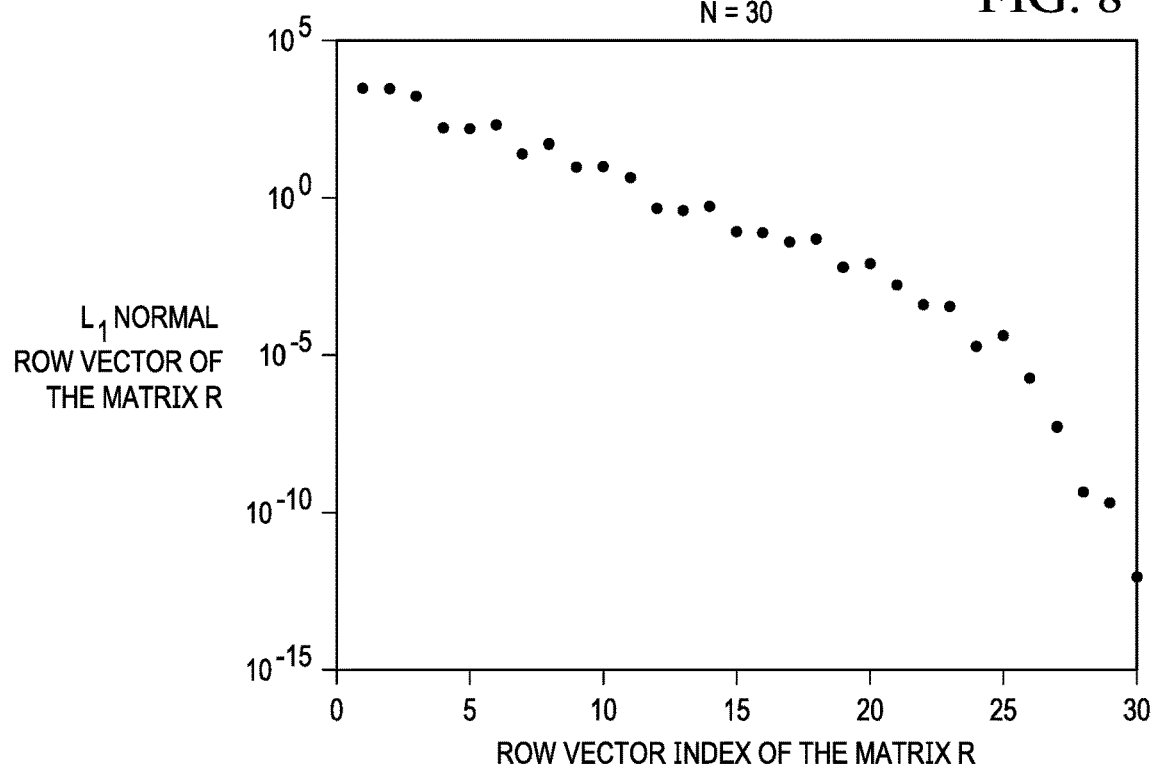

FIG. 7 and FIG. 8 show decay rates for activation sequences of the $T_2$ mode, in accordance with examples of the present disclosure. As shown on FIG. 7, values for the row vector index of the matrix R may not exceed a cut-off value of 24 for the $T_2$ mode with 54 bins. As shown on FIG. 8, values for the row vector index of the matrix R may not exceed a cut-off value of 23 for the $T_2$ mode with 30 bins.

Accordingly, the systems and methods of the present disclosure allow for the processing of NMR signals in a downhole environment. The systems and methods may include any of the various features disclosed herein, including one or more of the following statements.

Statement 1. An NMR downhole tool comprising: a housing; magnets disposed within the housing; an antenna extending along a circumference of the housing; and an information handling system configured to: acquire NMR signals with the antenna, wherein the NMR signals are based on an operating frequency, a static magnetic field $B_0$ defined by the antenna, and a radio frequency field $B_1$ defined by the magnets; project the NMR signals to a forward modeling space; and transmit vectors resulting from projections of the NMR signals to the forward modeling space.

Statement 2. The tool of the statement 1, wherein the information handling system is further configured to: solve a constrained linear system comprising Ax=b, x≥0, where A is a matrix of size M×N, and b is an NMR response vector of size M×a total number of echoes, where N is a number of unknowns or a number of bins.

Statement 3. The tool of the statement 2, wherein the information handling system is further configured to solve the constrained linear system with Tikhonov regularization.

Statement 4. The tool of the statement 3, wherein a least square solution, with the Tikhonov regularization, to the constrained linear system is: $x_{ls}=(A'A+\alpha L'L)^{-1}A'b$, $x_{ls}\geq 0$, where L is a regularization matrix of size N×N, where a is a regularization parameter, and where $X_{ls}$ is a product of the matrix $(A'A+\alpha L'L)^{-1}$ and the vector A'b.

Statement 5. The tool of the statement 4, wherein the information handling system is further configured to assume orthogonal-triangle decomposition of the A', where the A'=QR, where Q is a unitary matrix and R is an upper triangular matrix.

Statement 6. The tool of the statement 5, wherein the information handling system is further configured to determine that the $$x_{ls} = (A'A + \alpha L'L)^{-1}QRb = ((A'A + \alpha L'L)^{-1}Q)\begin{pmatrix} \langle r_1, b \rangle \\ \vdots \\ \langle r_k, b \rangle \\ \vdots \\ \langle r_N, b \rangle \end{pmatrix},$$

where $r_k$ is a $k^{th}$ row vector of the matrix R, and $\langle r_k, b \rangle$ is a vector dot product of $r_k$ with an NMR signal b, where an $L_1$ norm of $r_k$ is defined as $$\|r_k\|_1 = \sum_{l=1}^{M} |r_{k,l}|,$$

where $r_{k,i}$ is an $l^{th}$ element of the vector $r_k$.

Statement 7. The tool of the statement 6, wherein the $L_1$ norm of $r_k$ decays to 0.

Statement 8. The tool of the statement 7, wherein the information handling system is further configured to approximate the $x_{ls}$ with $$x_{ls} \approx ((A'A + \alpha L'L)^{-1}Q)\begin{pmatrix} \langle r_1, b \rangle \\ \vdots \\ \langle r_K, b \rangle \\ 0 \\ \vdots \\ 0 \end{pmatrix},$$

where K is an index such that $$\sum_{k=K+1}^{N} \|r_k\|_1 < 10^{-4},$$

where an approximation error is bounded by $$\max(b) \sum_{k=K+1}^{N} \|r_k\|_1 < 10^{-4} \max(b),$$

wherein max(b) is less than 40 porosity units.

Statement 9. An NMR downhole tool comprising: a housing; magnets disposed within the housing; an antenna extending along a circumference of the housing; and an information handling system configured to: receive NMR signals via the antenna, wherein the NMR signals are based on an operating frequency, a static magnetic field $B_0$ defined by the antenna, and a radio frequency field $B_1$ defined by the magnets; project the NMR signals to a forward modeling space; and transmit vector dot products resulting from projections of the NMR signals to the forward modeling space.

Statement 10. The tool of the statement 9, wherein the information handling system is further configured to quality control NMR data processing with a sum of squared errors (SSE), where the $$SSE = \sum_{i=1}^{M} ((Ax_{ls})_i - b_i)^2,$$

where $b_i$ is the $i^{th}$ echo of an NMR signal b, where $(Ax_{ls})_i$ is the $i^{th}$ component of a forward modeled vector $Ax_{ls}$, where the NMR signal b is not available for determining the SSE, where the NMR signal b is not transmitted.

Statement 11. The tool of the statement 10, wherein the information handling system is further configured to reformulate the SSE such that the $SSE=x_{ls}'A'Ax_{ls}-2\langle x_{ls},A'b\rangle + \langle b,b\rangle$.

Statement 12. The tool of the statement 11, wherein the information handling system is further configured to determine $\langle x_{ls},A'b\rangle$ and $\langle b,b\rangle$, and transmit the A'b, wherein the A'b is a vector, wherein the $\langle b,b\rangle$ is a single floating data point.

Statement 13. The tool of the statement 12, wherein the information handling system is further configured to transmit a subset of $\{\langle r_k,b\rangle, k=1, \ldots, N\}$, and configured to estimate $\langle x_{ls},A'b\rangle$ as $$\langle x_{ls}, A'b\rangle = \langle x_{ls}, QRb\rangle = \langle Q'x_{ls},$$

$$Rb \rangle = \left\langle Q'x_{ls}, \begin{pmatrix} \langle r_1, b\rangle \\ \vdots \\ \langle r_K, b\rangle \\ \vdots \\ \langle r_N, b\rangle \end{pmatrix} \right\rangle \approx \left\langle Q'x_{ls}, \begin{pmatrix} \langle r_1, b\rangle \\ \vdots \\ \langle r_K, b\rangle \\ 0 \\ \vdots \\ 0 \end{pmatrix} \right\rangle,$$

where k is a number of $\langle r_k,b\rangle$ to be transmitted.

Statement 14. The tool of the statement 13, wherein error for the estimation is bounded by $$\max(x_{ls}) \sum_{k=K+1}^{N} \|r_k\|_1 < 10^{-4}\max(x_{ls}).$$

Statement 15. The system of the statement 14, wherein the information handling system is further configured to transmit a dot product $\langle b,b\rangle$ for NMR data processing quality control.

Statement 16. A method to characterize a subterranean formation, the method comprising receiving NMR signals with an NMR tool, wherein the NMR tool is disposed in a wellbore extending into the subterranean formation; projecting the NMR signals to a forward modeling space; and transmitting vectors to surface equipment disposed above the subterranean formation, wherein the vectors result from projecting the NMR signals to the forward modeling space.

Statement 17. The method of the statement 16, further comprising transmitting vector dot products to the surface equipment, wherein the vector dot products result from projecting the NMR signals to the forward modeling space.

Statement 18. The method of the statement 16, further comprising controlling a quality of NMR data processing with a sum of squared errors (SSE), where the $$SSE = \sum_{i=1}^{M} ((Ax_{ls})_i - b_i)^2,$$

where $b_i$ is the $i^{th}$ echo of an NMR signal b, where $(Ax_{ls})_i$ is the $i^{th}$ component of a forward modeled vector $Ax_{ls}$, where the NMR signal b is not available for determining the SSE, where the NMR signal b is not transmitted.

Statement 19. The method of the statement 16, further comprising solving a constrained linear system comprising Ax=b, x≥0, where A is a matrix of size M×N, and b is an NMR response vector of size M×a total number of echoes, where N is a number of unknowns or a number of bins.

Statement 20. The method of the statement 19, further comprising solving the constrained linear system with Tikhonov regularization.

Although the present disclosure and its advantages have been described in detail, it should be understood that various changes, substitutions and alterations may be made herein without departing from the spirit and scope of the disclosure as defined by the appended claims. The preceding description provides various examples of the systems and methods of use disclosed herein which may contain different method steps and alternative combinations of components. It should be understood that, although individual examples may be discussed herein, the present disclosure covers all combinations of the disclosed examples, including, without limitation, the different component combinations, method step combinations, and properties of the system. It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present examples are well adapted to attain the ends and advantages mentioned as well as those that are inherent therein. The particular examples disclosed above are illustrative only and may be modified and practiced in different but equivalent manners apparent to those skilled in the art having the benefit of the teachings herein. Although individual examples are discussed, the disclosure covers all combinations of all of the examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of those examples. If there is any conflict in the usages of a word or term in this specification and one or more patent(s) or other documents that may be incorporated herein by reference, the definitions that are consistent with this specification should be adopted.

What is claimed is:

1. A nuclear magnetic resonance (NMR) downhole tool comprising:
    a housing;
    magnets disposed within the housing;
    an antenna extending along a circumference of the housing; and
    an information handling system configured to:
        receive NMR signals via the antenna, wherein the NMR signals are based on an operating frequency, a static magnetic field $B_0$ defined by the antenna, and a radio frequency field $B_1$ defined by the magnets;
        project the NMR signals to a forward modeling space; and
        transmit vectors resulting from projections of the NMR signals to the forward modeling space.

2. The NMR downhole tool of claim 1, wherein the information handling system is further configured to: solve a constrained linear system comprising Ax=b, x≥0, where A is a matrix of size M×N, and b is an NMR response vector of size M×a total number of echoes, where N is a number of unknowns or a number of bins.

3. The NMR downhole tool of claim 2, wherein the information handling system is further configured to solve the constrained linear system with Tikhonov regularization.

4. The NMR downhole tool of claim 3, wherein a least squares solution, with the Tikhonov regularization, to the constrained linear system is: $x_{ls}=(A'A+\alpha L'L)^{-1}A'b$, $x_{ls}\geq 0$, where L is a regularization matrix of size N×N, where $\alpha$ is a regularization parameter, and where $x_{ls}$ is a product of the matrix $(A'A+\alpha L'L)^{-1}$ and the vector A'b.

5. The NMR downhole tool of claim 4, wherein the information handling system is further configured to assume orthogonal-triangle decomposition of the A', where the A'=QR, where Q is a unitary matrix and R is an upper triangular matrix.

6. The NMR downhole tool of claim 5, wherein the information handling system is further configured to determine that the $$x_{ls} = (A'A + \alpha L'L)^{-1} QRb = ((A'A + \alpha L'L)^{-1} Q) \begin{pmatrix} \langle r_1, b \rangle \\ \vdots \\ \langle r_K, b \rangle \\ \vdots \\ \langle r_N, b \rangle \end{pmatrix},$$

where $r_k$ is a $k^{th}$ row vector of the matrix R, and $\langle r_k, b \rangle$ is a vector dot product of $r_k$ with an NMR signal b, where an $L_1$ norm of $r_k$ is defined as $$\|r_k\|_1 = \sum_{l=1}^{N} |r_{k,l}|,$$

where $r_{k,l}$ is an $l^{th}$ element of the vector $r_k$.

7. The NMR downhole tool of claim 6, wherein the $L_1$ norm of $r_k$ decays to 0.

8. The NMR downhole tool of claim 7, wherein the information handling system is further configured to approximate the $x_{ls}$ with $$x_{ls} \approx ((A'A + \alpha L'L)^{-1}Q) \begin{pmatrix} \langle r_1, b \rangle \\ \vdots \\ \langle r_K, b \rangle \\ 0 \\ \vdots \\ 0 \end{pmatrix},$$

where K is an index such that $$\sum_{k=K+1}^{N} \|r_k\|_1 < 10^{-4},$$

where an approximation error is bounded by $$\max(b) \sum_{k=K+1}^{N} \|r_k\|_1 < 10^{-4} \max(b),$$

wherein max(b) is less than 40 porosity units.

9. A nuclear magnetic resonance (NMR) downhole tool comprising:
   a housing;
   magnets disposed within the housing;
   an antenna extending along a circumference of the housing; and
   an information handling system configured to:
      receive NMR signals via the antenna, wherein the NMR signals are based on an operating frequency, a static magnetic field $B_0$ defined by the antenna, and a radio frequency field $B_1$ defined by the magnets;
      project the NMR signals to a forward modeling space; and
      transmit vector dot products resulting from projections of the NMR signals to the forward modeling space.

10. The NMR downhole tool of claim 9, wherein the information handling system is further configured to quality control NMR data processing with a sum of squared errors (SSE), where the $$SSE = \sum_{i=1}^{M} ((Ax_{ls})_i - b_i)^2,$$

where $b_i$ is the $i^{th}$ echo of an NMR signal b, where $(Ax_{ls})_i$ is the $i^{th}$ component of a forward modeled vector $Ax_{ls}$, where the NMR signal b is not available for determining the SSE, where the NMR signal b is not transmitted.

11. The NMR downhole tool of claim 10, wherein the information handling system is further configured to reformulate the SSE such that the SSE=$x_{ls}'A'Ax_{ls} - 2\langle x_{ls}, A'b \rangle + \langle b, b \rangle$.

12. The NMR downhole tool of claim 11, wherein the information handling system is further configured to determine $\langle x_{ls}, A'b \rangle$ and $\langle b, b \rangle$, and transmit the A'b, wherein the A'b is a vector, wherein the $\langle b, b \rangle$ is a single floating data point.

13. The NMR downhole tool of claim 12, wherein the information handling system is further configured to transmit a subset of $\{\langle r_k, b \rangle, k=1, \ldots, N\}$, and configured to estimate $\langle x_{ls}, A'b \rangle$ as $$\langle x_{ls}, A'b \rangle = \langle x_{ls}, QRb \rangle = \langle Q'x_{ls},$$

$$Rb \rangle = \left\langle Q'x_{ls}, \begin{pmatrix} \langle r_1, b \rangle \\ \vdots \\ \langle r_K, b \rangle \\ \vdots \\ \langle r_N, b \rangle \end{pmatrix} \right\rangle \approx \left\langle Q'x_{ls}, \begin{pmatrix} \langle r_1, b \rangle \\ \vdots \\ \langle r_K, b \rangle \\ 0 \\ \vdots \\ 0 \end{pmatrix} \right\rangle,$$

where k is a number of $\langle r_k, b \rangle$ to be transmitted.

14. The NMR downhole tool of claim 13, wherein error for the estimation is bounded by $$\max(x_{ls}) \sum_{k=K+1}^{N} \|r_k\|_1 < 10^{-4} \max(x_{ls}).$$

15. The NMR downhole tool of claim 14, wherein the information handling system is further configured to transmit a dot product $\langle b, b \rangle$ for NMR data processing quality control.

16. A method to characterize a subterranean formation, the method comprising:
   receiving nuclear magnetic resonance (NMR) signals with an NMR tool, wherein the NMR tool is disposed in a wellbore extending into the subterranean formation;
   projecting the NMR signals to a forward modeling space with the NMR tool; and
   transmitting vectors to surface equipment disposed above the subterranean formation, wherein the vectors result from projecting the NMR signals to the forward modeling space.

17. The method of claim 16, further comprising transmitting vector dot products to the surface equipment, wherein the vector dot products result from projecting the NMR signals to the forward modeling space.

18. The method of claim 16, further comprising controlling a quality of NMR data processing with a sum of squared errors (SSE), where the $$SSE = \sum_{i=1}^{M} ((Ax_{ls})_i - b_i)^2,$$

where $b_i$ is the $i^{th}$ echo of an NMR signal b, where $(Ax_{ls})_i$ is the $i^{th}$ component of a forward modeled vector $Ax_{ls}$, where the NMR signal b is not available for determining the SSE, where the NMR signal b is not transmitted.

19. The method of claim 16, further comprising solving a constrained linear system comprising $Ax=b$, $x \geq 0$, where A is a matrix of size M×N, and b is an NMR response vector of size M×a total number of echoes, where N is a number of unknowns or a number of bins.

20. The method of claim 19, further comprising solving the constrained linear system with Tikhonov regularization.

\* \* \* \* \*